United States Patent
Graf et al.

(10) Patent No.: US 7,009,403 B2
(45) Date of Patent: Mar. 7, 2006

(54) CIRCUIT ARRANGEMENT FOR CONTROLLING AND DETECTING THE LOAD CURRENT THROUGH A LOAD

(75) Inventors: Alfons Graf, Kaufering (DE); Rainald Sander, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/738,010

(22) Filed: Dec. 16, 2003

(65) Prior Publication Data

US 2004/0155662 A1   Aug. 12, 2004

(30) Foreign Application Priority Data

Dec. 16, 2002   (DE) .............................. 102 58 766

(51) Int. Cl.
*G01R 31/08* (2006.01)
*G05F 1/00* (2006.01)
*G05F 1/573* (2006.01)

(52) U.S. Cl. .................. 324/522; 327/518; 323/278

(58) Field of Classification Search ............. 324/522; 327/518, 519, 520, 545, 546; 323/278
See application file for complete search history.

(56) References Cited

U.S. PATENT DOCUMENTS

| 6,028,417 A | * | 2/2000 | Ang et al. | 323/209 |
| 6,271,694 B1 | * | 8/2001 | Uebele | 327/110 |
| 6,316,967 B1 | * | 11/2001 | Takagi et al. | 327/50 |
| 6,469,647 B1 | * | 10/2002 | Kinugasa et al. | 341/145 |

FOREIGN PATENT DOCUMENTS

| DE | 198 23 140 A1 | | 4/1999 |
| DE | 198 12 920.3 | * | 12/1999 |
| DE | 198 12 920 A1 | | 12/1999 |

\* cited by examiner

Primary Examiner—Vincent Q. Nguyen
Assistant Examiner—Jeff Natalini
(74) Attorney, Agent, or Firm—Dicke, Billig & Czaja, PLLC

(57) ABSTRACT

Circuit arrangement for controlling the current flow through a load in the case of detection of the current flow according to the current sense principle. The circuit arrangement has a load transistor and a plurality of auxiliary transistors of identical type, which have a control terminal which is connected or can be connected to the control terminal of the load transistor. In the case of the circuit arrangement according to the invention, provision is made of a switching mechanism by which the auxiliary transistors, optionally or depending on the load current or depending on a load path voltage dropped across the load path of the load transistor, can be connected in parallel individually or as a plurality.

18 Claims, 6 Drawing Sheets

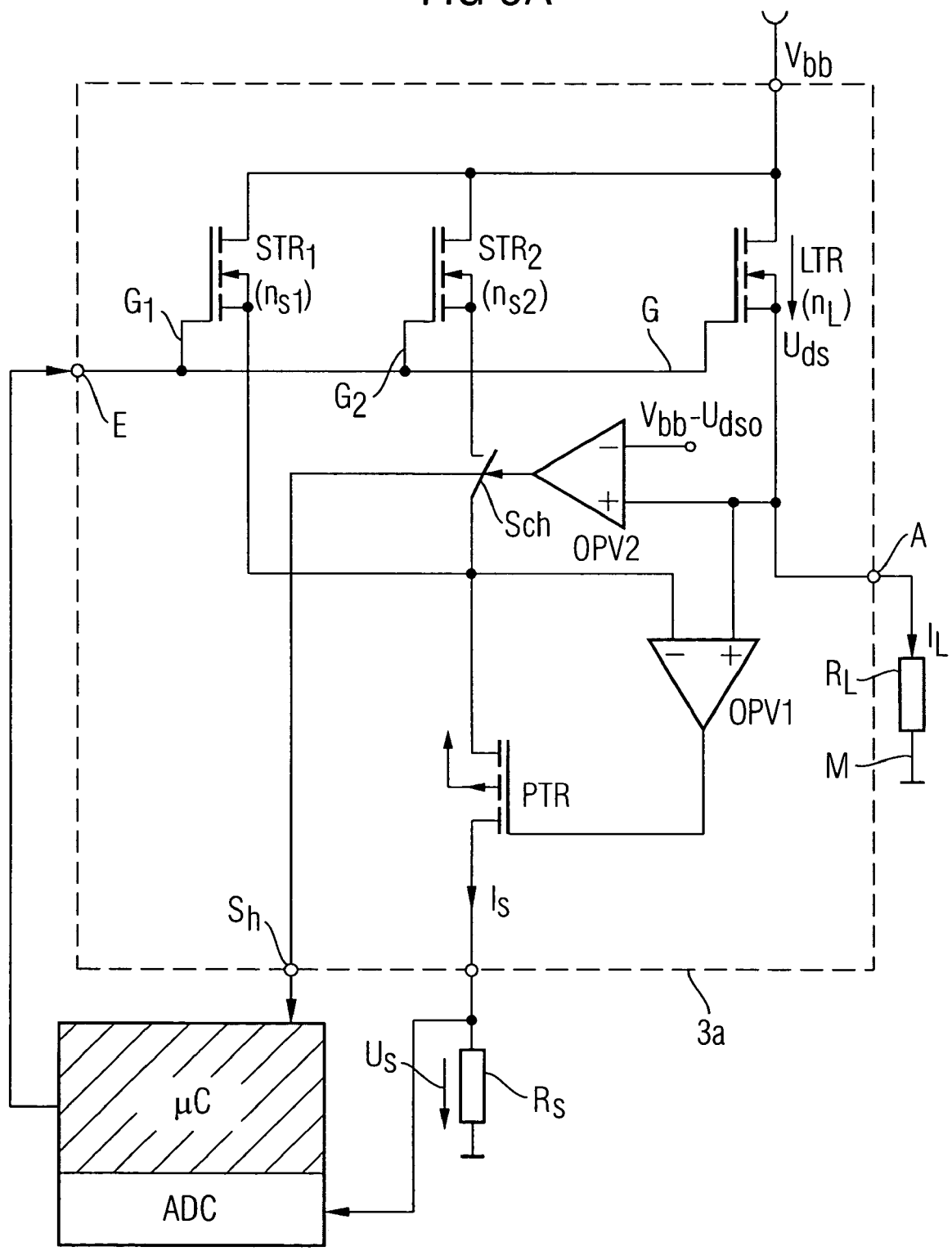

CIRCUIT ARRANGEMENT FOR CONTROLLING AND DETECTING THE LOAD CURRENT THROUGH A LOAD

CROSS-REFERENCE TO RELATED APPLICATIONS

This Utility Patent Application claims priority to German Patent Application No. DE 102 58 766.3, filed on Dec. 16, 2002, which is incorporated herein by reference.

BACKGROUND

The invention relates to a circuit arrangement for controlling and detecting the load current through a load having a load transistor and at least one auxiliary transistor. Each of the transistors have a control terminal, and in each case, a load path and a first load path terminal and a second load path terminal. The load is connected in series with the load path of the load transistor and this series circuit is connected between terminals for supply potential and reference potential. A current measuring arrangement having a first and second input respectively is connected to the first load path terminal of the load transistor and to the first load path terminal of the at least one auxiliary transistor. The current measurement arrangement also has an output, at which a signal dependent on the load current can be tapped off, and a drive unit connected to the control terminal.

A known circuit arrangement of this type is disclosed in DE 198 12 920 A1.

In the case of circuit arrangements of this type, the measurement of the load current through the load is effected according to the so-called "current sense principle". In this case, the load current that flows into the load via the load transistor, which is very large under certain circumstances, is determined indirectly by way of a measurement current flowing through the auxiliary transistor. The ratio $I_L/I_S$ of load current to measurement current, the so-called sense ratio, corresponds to the ratio of the transistor areas or number of transistor cells of the load transistor and of the auxiliary transistor if these two transistors are operated at the same operating point. In order to set the common operating point, the load transistor and the auxiliary transistor have a common control terminal, and they are connected to an identical supply potential. A regulating arrangement, which is part of the measuring arrangement, furthermore has the effect that the potential at the first load path terminal of the auxiliary transistor is set to the value of the potential of the first load path terminal of the load transistor. The same voltage in each case is thus present between the common control terminal and the first load path terminals of the two transistors. The voltage across the load path of the load transistor likewise corresponds to the voltage across the load path of the auxiliary transistors, so that the two transistors are operated at the same operating point.

The accompanying FIG. 1 illustrates an example—designated by the reference numeral 1—of the above-described known circuit arrangement for controlling and detecting the load current through a load $R_L$. As mentioned, the load transistor LTR, here an n-channel FET, and the auxiliary transistor STR, here likewise an n-channel FET, which are interconnected on the drain side and gate side, are at the same supply potential $V_{bb}$. The load path D-S of the load transistor LTR is connected in series with the load connected to the output A, here indicated by way of example by a load resistor $R_L$, through which the load current $I_L$ flows. Connected to the same circuit point, that is to say to the source electrode S of the load transistor LTR, is a first input of a current measuring arrangement MA comprising an operational amplifier OPV, a p-channel regulating transistor PTR and a measuring resistor $R_S$. The second input of the current measuring arrangement MA is connected together with the source electrode of the regulating transistor PTR to the source electrode S of the auxiliary transistor STR so that the potential at the source electrode S of the auxiliary transistor STR is set to the value of the source potential of the load transistor LTR. The current $I_S$ flows through the measuring resistor $R_S$, which current is ideally in a fixed ratio to the load current $I_L$, so that a voltage $U_S$ proportional to the current $I_S$ is dropped across the measuring resistor $R_S$, which voltage is input into an analog-to-digital converter ADC of a drive unit μC. The drive unit μC supplies a drive signal to an input terminal E of the circuit arrangement. For the case where the supply potential $V_{bb}$ is the higher potential and the reference potential M is the lower potential, for example ground, and the load transistor is an n-channel FET, the circuit arrangement illustrated in FIG. 1 forms a so-called "high-side switch".

Comparators, such as the operational amplifier—designated OPV—of the current measuring arrangement MA, and in particular comparators produced in integrated CMOS technology, disadvantageously have an unavoidable voltage offset which, in the circuit arrangement illustrated in FIG. 1, has the effect that a readjustment of the regulating transistor PTR no longer takes place even when a voltage difference corresponding to the voltage offset of the comparator OPV exists between the potentials of the first load path terminals, that is to say the source electrodes of the load transistor and of the auxiliary transistor. The voltage across the load path D-S of the auxiliary transistor STR thus always deviates from the voltage across the load path of the load transistor by the magnitude of the voltage offset of the comparator OPV. In other words, the load transistor LTR and the auxiliary transistor STR do not operate exactly at the same operating point.

In the case of large load currents and, by virtue thereof, a correspondingly large voltage drop exists across the load path of the load transistor, and this deviation of the load path voltage of the auxiliary transistor STR by the value of the voltage offset of the comparator OPV, which is usually in the region of a few millivolts, is hardly significant at all. However, if very small load currents flow, and bring about a very small voltage drop across the load path of the load transistor LTR, which voltage drop, in the extreme case, is in the region of the voltage offset of the comparator OPV, then said voltage offset has a considerable effect on the operating point setting of the auxiliary transistor STR, so that the operating points of the two transistors deviate considerably from one another and the measurement current $I_S$ is no longer proportional to the load current $I_L$. The measurement result is thereby corrupted to a significant extent.

DE 198 12 920 A1 mentioned above proposes solving this problem by additionally connecting in parallel with the load transistor LTR at least one second load transistor, which can be driven via a second control terminal by the drive unit μC depending on the load current or depending on a load path voltage obtained across the load path of the load transistors.

Another possibility, not used in practice, would be to increase the value of the measuring resistor $R_S$ in the case of small measurement currents $I_S$, thereby obtaining a higher voltage drop $U_S$ for the same current $I_S$. The external circuitry outlay for changing over the resistor is disadvantageous in this case.

At the present time, the so-called sense ratio nL/nS cannot be decreased arbitrarily by increasing the number of auxiliary transistors STR, since, due to the higher measurement current Is thus achieved, the regulating transistor PTR for the upper current range, in the case of which very large measurement currents $I_S$ flow, would become very large and thus expensive on account of the power loss consumed by it. In practice, the sense ratio nL/nS is at present downwardly limited to 5,000/1, for example.

SUMMARY

One embodiment of the present invention provides a circuit arrangement for controlling and detecting the load current through a load which, even in the case of small load currents or small voltage drops across the load path of the load transistor, yields an accurate measurement signal proportional to the load current and can be adapted to different load currents or is automatically adapted to different load currents while maintaining the accuracy of the load current measurement. With this embodiment, the absolute magnitude of the signal at the measuring resistor is increased by means of a range changeover in order to better utilize the resolution of the analog-to-digital converter ADC.

In accordance with one aspect of the invention, a circuit arrangement of the generic type for controlling and detecting the load current through a load is characterized in that provision is made of at least one second auxiliary transistor, which is of identical type to the at least one auxiliary transistor and has a control terminal that is connected, or can be connected, to the control terminal of the load transistor. The circuit arrangement has switching means by which the auxiliary transistors, optionally or depending on the load current or depending on a load path voltage obtained across the load path of the load transistor, can be connected in parallel with the at least one auxiliary transistor individually or as a plurality.

The flexibility and adaptability of the circuit arrangement according to the invention is thereby improved if the switching means are set up for connecting the load paths of n auxiliary transistors in parallel, where n is greater than, or equal to, 2.

In order to connect the auxiliary transistors in parallel, depending on the load current or depending on a load path voltage dropped across the load path of the load transistor, the circuit arrangement according to one embodiment of the invention may advantageously have detection means that detect if the load current falls below a predetermined threshold and thereupon generate an output signal that is applied to the switching means.

The detection means may advantageously be developed in that it prescribes n threshold values for the load current and the output signal of the detection means is set up for acting upon n switching means in accordance with the load current respectively falling below a threshold value.

The detection means may also be integrated in the drive unit if the latter contains a program-controlled microprocessor, and thus evaluates the instance of the load current falling below a threshold value on the basis of the measurement current that has been subjected to analog to digital conversion correspondingly falling below a threshold value, and generates a corresponding output signal in order to act upon the switching means for connecting the auxiliary transistors in parallel in a manner dependent on the load current.

In one exemplary embodiment of the circuit arrangement according to the invention, all the auxiliary transistors may be connected by their control terminals to the control terminal of the load transistor and their second load path terminals may be connected together to the second load path terminal of the load transistor. In this case, the switching means is set up in such a way that, optionally or depending on the load current, it connects the first load path terminals of the auxiliary transistors to one another and to the second input of the current measuring arrangement.

In one exemplary embodiment, the switching means may have n individual switches, each having a first pole and a second pole, which can be connected to the first pole by means of a switching signal, of which the first pole is respectively connected to the first load path terminal of each of the auxiliary transistors and the second poles of all switches are jointly connected to the second input of the current measuring arrangement. In this exemplary embodiment, the drive unit may supply the switching signals for the optional actuation of each individual switch in uncoded fashion.

As an alternative, the switching means may have decoding means. In this case, the drive unit supplies a coded switching signal, which is decoded by the decoding means. The decoding means may have a decoding logic unit or a demultiplexer.

In an alternative exemplary embodiment of the circuit arrangement according to the invention, all the auxiliary transistors are connected in parallel by their load paths and the switching means is set up in such a way that it optionally connects the control terminals of the auxiliary transistors to one another and to the control terminal of the load transistor.

In the latter case, the switching means may have n individual switches each having a first pole and a second pole, which can be connected to the first pole by means of a switching signal, of which the first pole is respectively connected to the control terminal of each of the auxiliary transistors and the second poles of all switches are jointly connected to the control terminal of the load transistor. In this case, as in the first exemplary embodiment, the drive unit may supply switching signals for the optional actuation of each individual switch in uncoded fashion, or alternatively in coded fashion. In the last-mentioned case, the switching means has decoding means that decode the switching signal. In this alternative embodiment, the decoding means may have a decoding logic unit or a demultiplexer.

In the last-mentioned exemplary embodiment, in which the control terminals of the auxiliary transistors are switched by the switching means, the switching means may be integrated in the drive unit, the latter supplying individual drive signals for optionally driving the control terminals of the auxiliary transistors, or as an alternative, supplying a coded drive signal, which is decoded by decoding means in the circuit arrangement to form individual drive signals.

In one embodiment of the invention, the load transistor and the auxiliary transistors of the circuit arrangement are n-channel FETs and the regulating transistor is a p-channel FET and the circuit arrangement according to the invention is set up as a high-side switch.

The above and further advantageous features of the circuit arrangement according to the invention are explained in detail on the basis of exemplary embodiments in the description below, which relates to the accompanying drawing.

BRIEF DESCRIPTION OF THE DRAWINGS

FIG. 3A illustrates a third exemplary embodiment of the circuit arrangement according to the invention with detection means for load current detection and, in a manner dependent thereon, connecting the auxiliary transistors in parallel, to be precise by connection of their first load path terminals.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
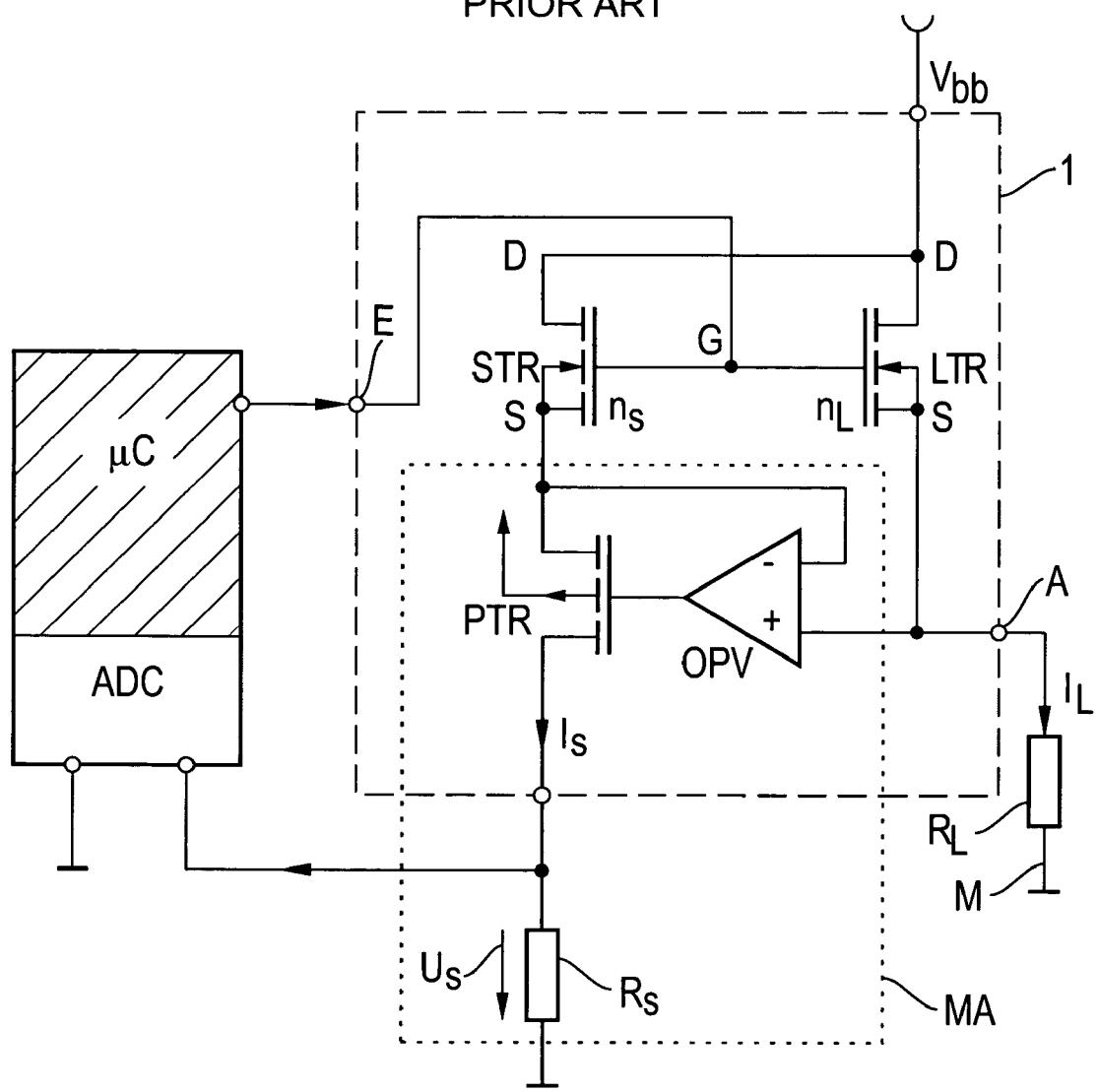
FIG. 1 schematically illustrates a prior art circuit arrangement for controlling and detecting the load current through a load.
Figure 2A:
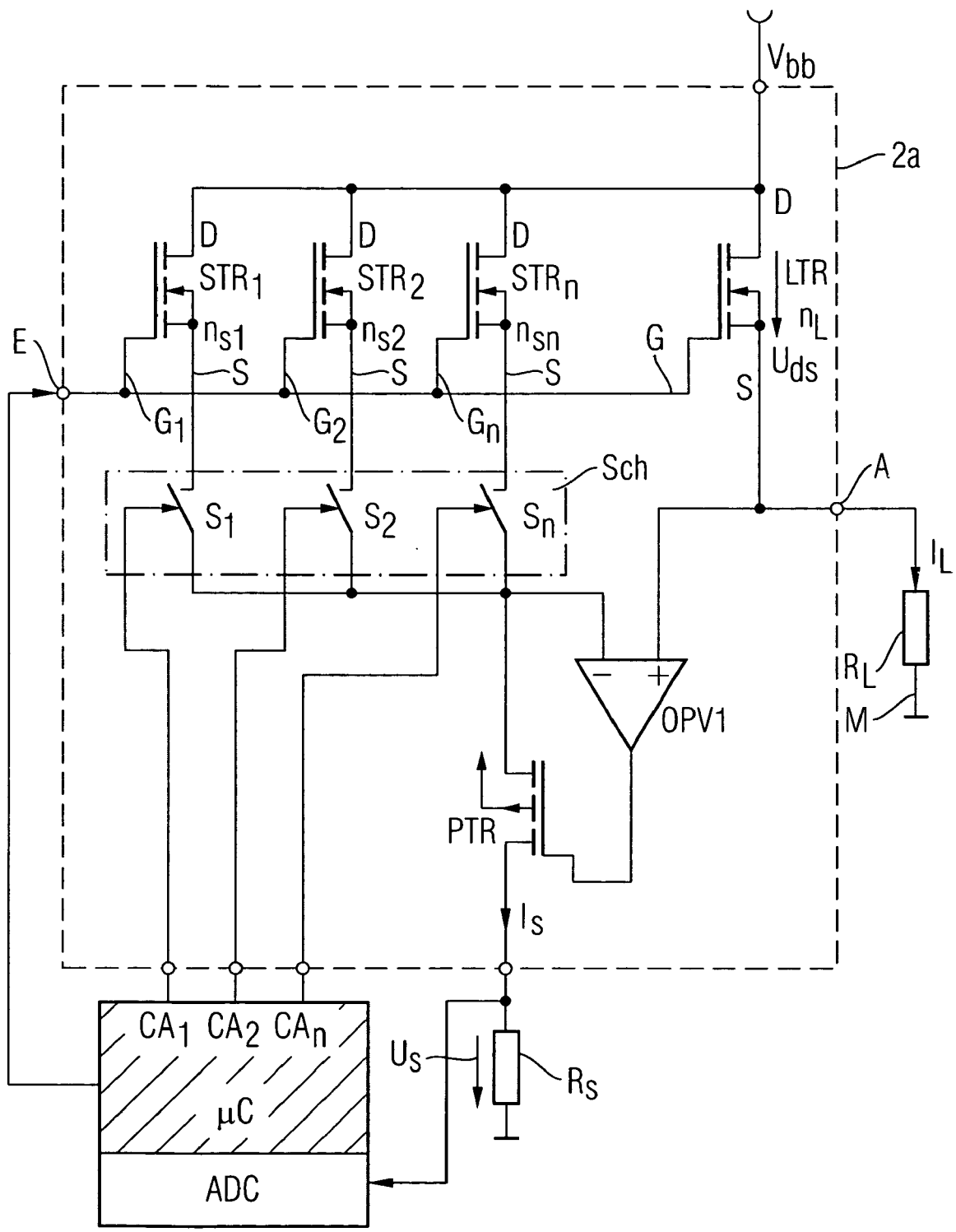
FIG. 2A schematically illustrates a first exemplary embodiment of a circuit arrangement according to the invention, in which individual switches for connection of the first load path terminals of the auxiliary transistors are provided in the switching means.

In FIG. 2A, a first exemplary embodiment of the circuit arrangement according to the invention is designated by the reference numeral 2a, and the same elements as in FIG. 2 are provided with the same reference symbols. In this exemplary embodiment of the circuit arrangement according to the invention, n auxiliary transistors STR1, STR2, ..., STRn are provided in such a way that their control terminals G1, G2, ..., Gn are jointly connected to the control terminal G of the load transistor LTR and their second load path terminals D are jointly connected to the load path terminal D of the load transistor. For optionally connecting the auxiliary transistors STR1, STR2, ..., STRn in parallel, switching means Sch have n individual switches S1, S2, ..., Sn, which are connected by their first poles jointly to the second input of the current measuring arrangement and by their second poles individually to the first load path terminals S of the individual auxiliary transistors STR1, STR2, ..., STRn. A respective discrete switching signal CA1, CA2, ..., CAn from the drive unit $\mu$C serves for optionally switching on the switches S1, S2, ..., Sn. As in the example of the prior art shown in FIG. 1, a voltage $U_S$ proportional to the measurement current $I_S$ is dropped across the current measuring resistor $R_S$, which voltage is fed to the analog-to-digital converter ADC. The switch setting by the switching signals CA1, CA2, ..., CAn in the switching means Sch is virtually static and can be decided by the user of the circuit arrangement.

In this way, by means of the switching signal CA1, CA2, ..., CAn supplied to the circuit arrangement 2a externally by the drive unit $\mu$C, the number of auxiliary transistors STR1, STR2, ..., STRn connected in parallel and thus the sense ratio $I_L/I_S$=nL/nS can optionally be changed over, so that the circuit arrangement 2a shown in FIG. 2A can be adapted to different load currents. In the case of very small load currents or if the load resistor $R_L$ is very large, the measurement current Is can be increased by connecting a plurality of auxiliary transistors in parallel and the measurement signal at the ADC can thus be increased in order to better utilize the measurement range of the ADC and thus to obtain higher accuracy. Through actuation of the n switches S1, S2, ..., Sn, it is possible to set $n^2-1$ ratios for the measurement current $I_S$. Instead of supplying the switching signals CA1, CA2, ..., CAn discretely, that is to say in uncoded fashion, the drive unit $\mu$C can also generate them in coded fashion and apply them to the circuit arrangement 2a. The switching means Sch may then contain decoding means which decode the individual discrete switching signals for the switches S1, S2, ..., Sn from the coded switching signal. It is readily apparent to the person skilled in the art that decoding means of this type may have e.g. a demultiplexer.

The function of the circuit arrangement 2a shown in FIG. 2A is as follows. Each of the n auxiliary transistors STR1, STR2, ..., STRn comprises one or more sense cells nS1, nS2, ..., nSn. If switch S1 is closed by the switching signal CA1, then the sense ratio $I_L/I_S$=nL/nS1 holds true. If, in addition to S1, the switch S2 is closed with the aid of the switching signal CA2, then a new sense ratio results with $I_L/I_{S2}$=nL/(nS1+nS2). Through optional actuation of the n switches S1, S2, ..., Sn, it is thus possible to set $n^2-1$ sense ratios. Through a measurement of the sense current $I_S$ performed by the drive unit $\mu$C, the latter may also be set up for automatically generating and supplying the switching signals CA1, CA2, ..., CAn depending on the measured sense current intensity $I_S$.

Figure 2B:
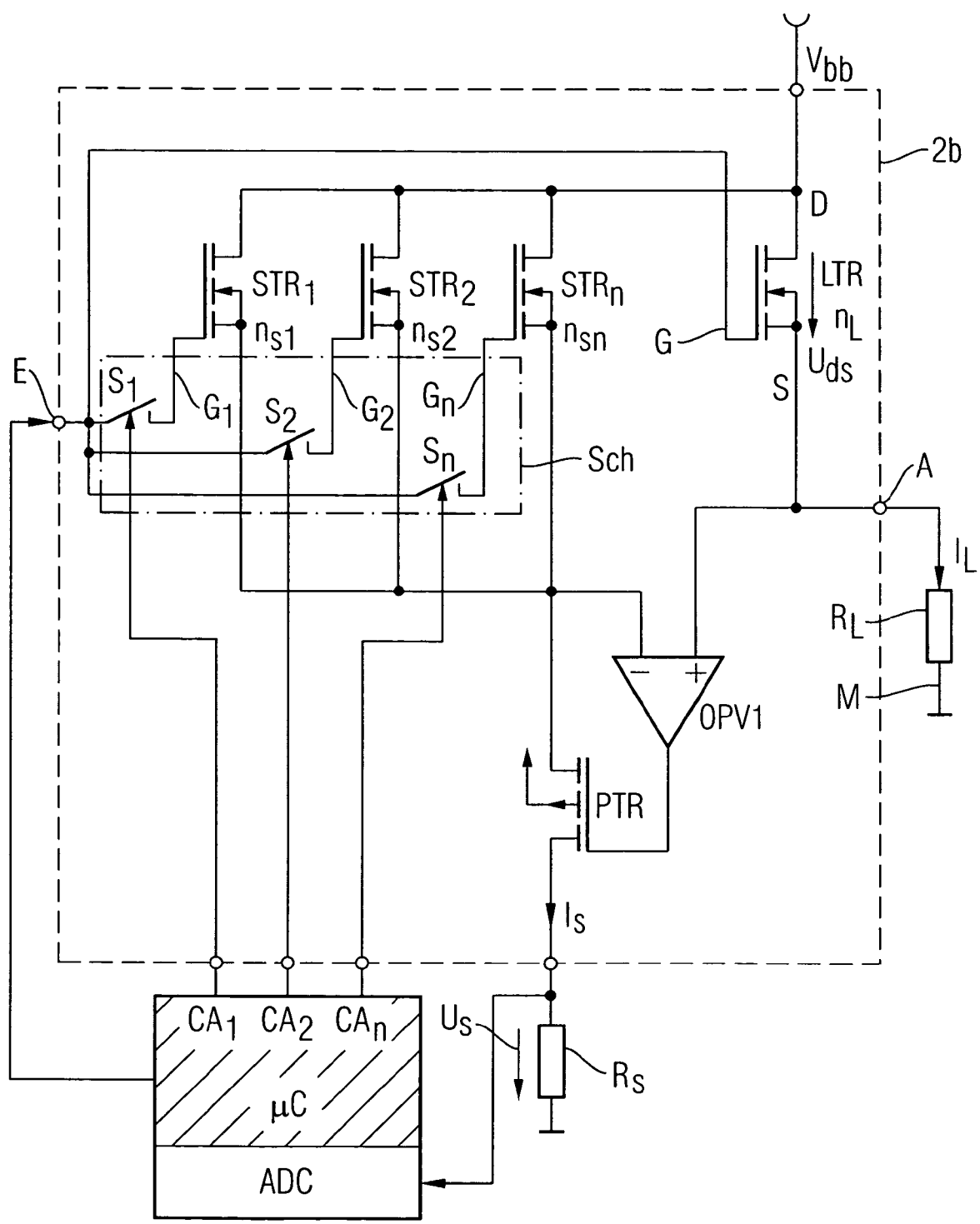
FIG. 2B illustrates a second exemplary embodiment of the circuit arrangement according to the invention in a first variant, in which the control terminals of the auxiliary transistors are connected by individual switches provided in the switching means.

FIG. 2B illustrates a second exemplary embodiment of the circuit arrangement according to the invention, which is designated here by the reference symbol 2b. Instead of the first load path terminals of the auxiliary transistors being switched as in FIG. 2A, in the exemplary embodiment 2b shown in FIG. 2B, the control terminals G1, G2, ..., Gn of the auxiliary transistors STR1, STR2, ..., STRn are switched by individual switches S1, S2, ..., Sn in the switching means Sch, for which purpose the drive unit $\mu$C supplies discrete switching signals CA1, CA2, ..., CAn externally.

Figure 2C:
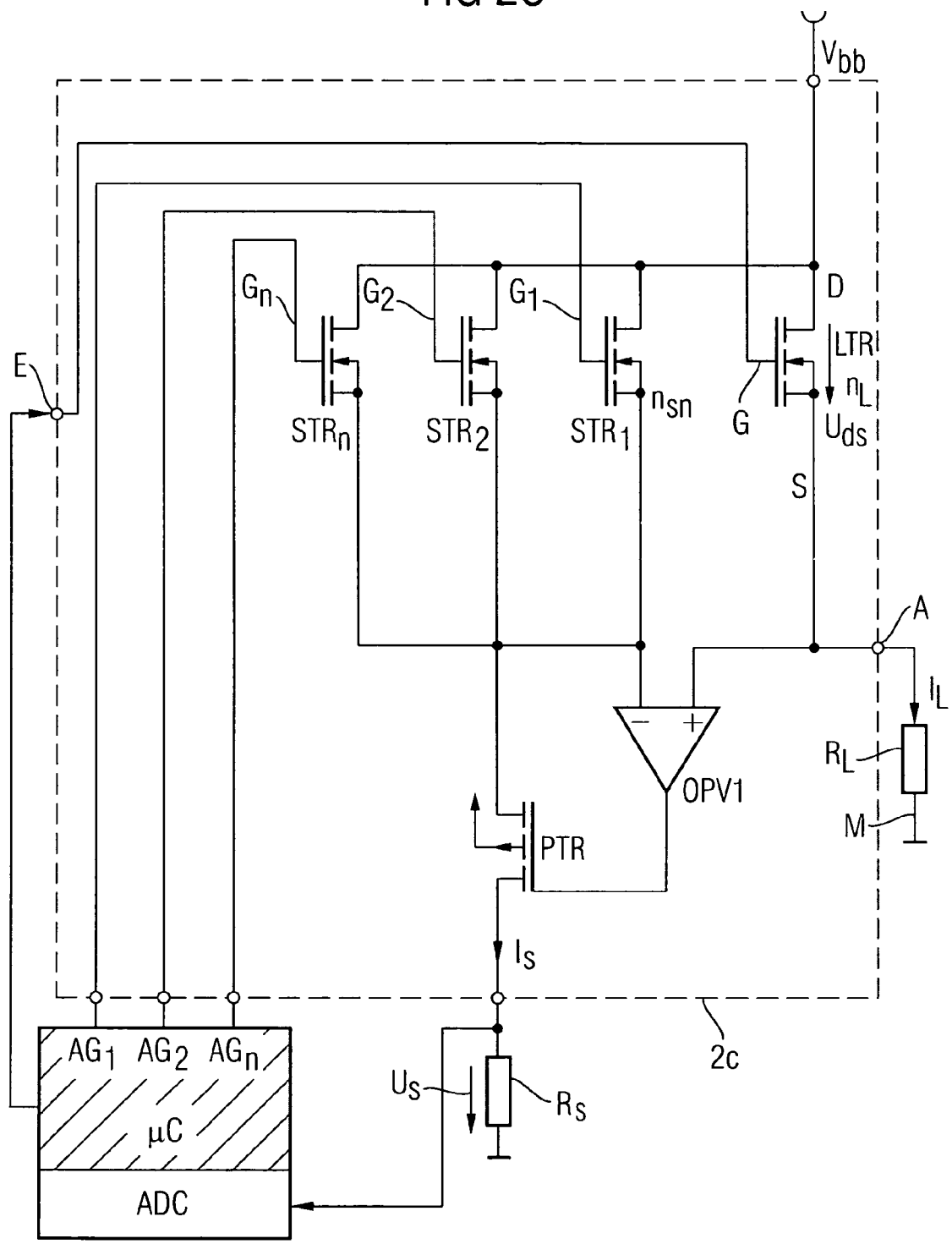
FIG. 2C illustrates a second variant of the second exemplary embodiment, in which the drive unit passes the signals for connecting the auxiliary transistors in parallel individually to the control terminals of said auxiliary transistors.

FIG. 2C illustrates a variant of the second exemplary embodiment—shown in FIG. 2B—of the circuit arrangement according to the invention, which is designated by the reference symbol 2c in FIG. 2C. Instead of the switching means being provided in the circuit arrangement, they are situated in the drive unit $\mu$C in FIG. 2C, which drive unit applies individual drive signals functioning as gate signals AG1, AG2, AGn to the control terminals (gates) of the individual auxiliary transistors STR1, STR2, ..., STRn in order optionally to connect the latter in parallel. In all other features, the variant of the second exemplary embodiment 2c of the circuit arrangement according to the invention as shown in FIG. 2C corresponds to the first variant of the second exemplary embodiment as shown in FIG. 2B.

In FIG. 3A, a third exemplary embodiment of the circuit arrangement according to the invention is shown and provided with the reference symbol 3a. In the exemplary embodiment 3a, the sense ratio is automatically changed over in the case of different loading of the load transistor LTR. This is done with the aid of a detection circuit having a second comparator OPV2, which is connected to the first input of the current measuring arrangement by its first input and has a threshold potential $V_{bb}-U_{DS0}$ applied to its second input A switching signal for switching a switch Sch is output at the output of the comparator OPV2. FIG. 3A shows a simplified example with two auxiliary transistors STR1 and STR2, which, depending on the load current, are operated individually or in a manner connected in parallel. If the voltage, which is tapped off at the output terminal A and corresponds to the load current $I_L$, falls below the threshold given by $V_{bb}-V_{DS0}$, the comparator OPV2 generates the switching signal for switching on the switch Sch, so that both auxiliary transistors STR1, STR2 are connected in parallel. For higher loading, for example given $I_{L1}=50$ A, the switch Sch is opened, and the sense ratio is determined by the number of cells (area) NS1 of the auxiliary transistor STR1. If the loading of the load transistor LTR decreases, for example if a load current $I_{L2}=0.5$ A flows, the switch Sch is closed by the output signal of the comparator OPV2, and $I_{L2}/I_{S2}=nL/(nS1+nS2)$ holds true. In order to simplify the elucidation, the circuit arrangement 3a of FIG. 3A is shown with only two auxiliary transistors STR1 and STR2. It can likewise be realized with n switches and n auxiliary transistors STR. In order that the drive unit $\mu C$ identifies which sense ratio is currently active, the switch position of the switch Sch is passed toward the outside by means of the signal SH. In the case of a plurality of switches, this may be effected for example by means of a multiplexer or by means of a shift register.

Figure 3B:
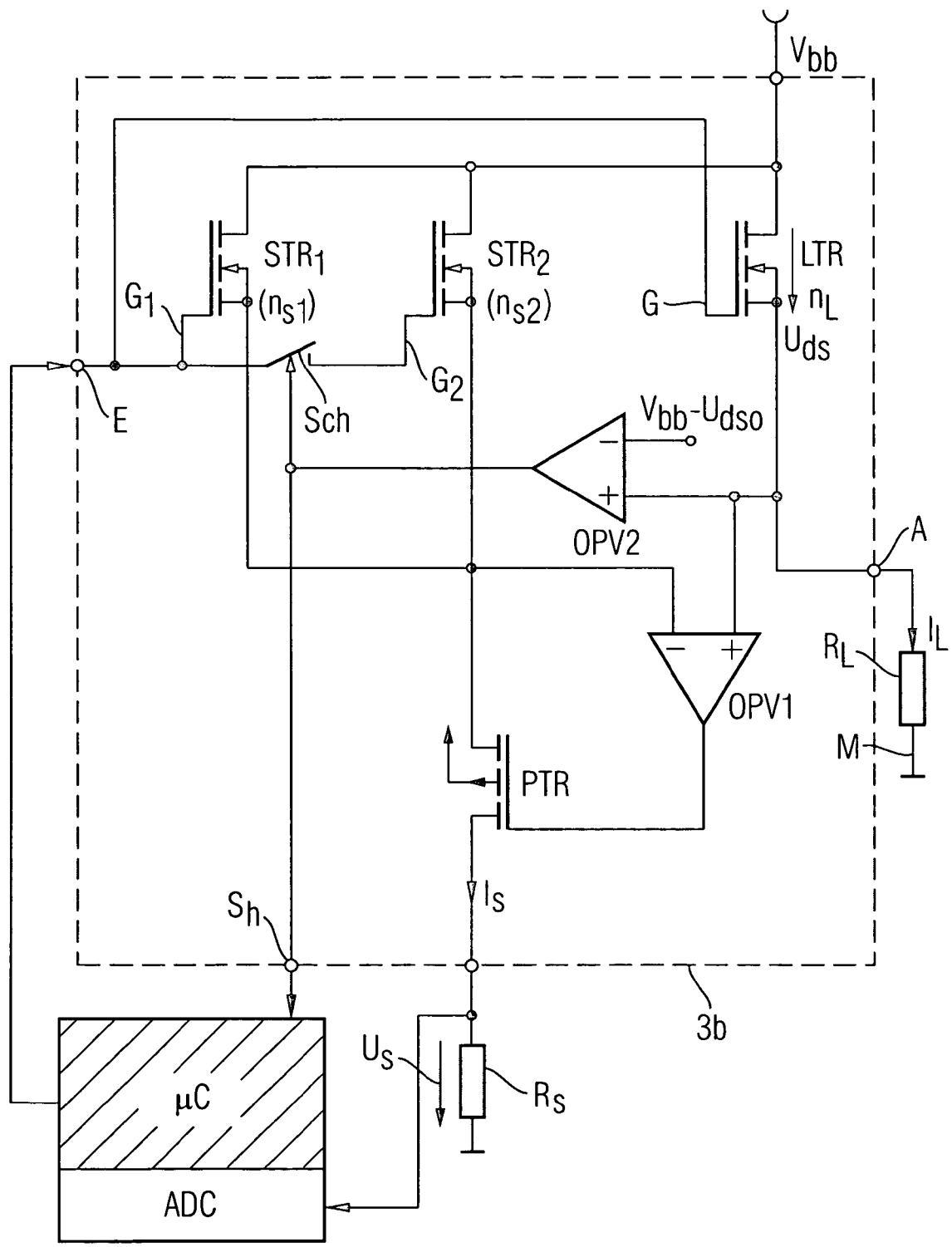
FIG. 3B illustrates the third exemplary embodiment of the circuit arrangement according to the invention in a second variant, in which, instead of the first load path terminals, the control terminals are connected for connecting the auxiliary transistors in parallel depending on the load current falling below a threshold, this last being detected by the detection means.

FIG. 3B illustrates a variant—designated by the reference symbol 3b—of the first exemplary embodiment shown in FIG. 3A, in which—likewise in a simplification—two auxiliary transistors STR1 and STR2 can be connected in parallel by a switch Sch. In contrast to the variant of the circuit arrangement 3a as shown in FIG. 3A, in the case of the variant shown in FIG. 3B, rather than the first load path terminals of the auxiliary transistors STR1 and STR2, the control terminals G1, G2 of the auxiliary transistors STR1, STR2 are connected to one another by the switch Sch. Here the switch Sch is turned on under the control of the output signal of the comparator OPV2, and the control terminals G1, G2 of the auxiliary transistors STR1 and STR2 are thus connected to one another if the load current $I_L$ detected by the comparator OPV2 falls below a threshold set by $V_{bb}-U_{DS0}$, whereas the switch Sch remains opened in the other cases. Here the switch position of the switch Sch may be interrogated using the signal SH supplied to the drive unit $\mu C$, so that externally it is possible to identify which sense ratio is currently active. All other circuit details and variation possibilities described previously for the first variant 3a shown in FIG. 3A also apply to the second variant 3b shown in FIG. 3B.

A realization of the circuit arrangement according to the invention as has been described above in the exemplary embodiments and their variants is possible in MOS technology with simple means. The load transistor LTR used for connecting loads is usually realized as a vertical transistor comprising a multiplicity of individual FET cells whose gate, source and drain terminals are interconnected to form a gate, source and drain terminal of the load transistor. If the load transistor LTR and the auxiliary transistors STR are realized as n-channel FETs and the regulating transistor PTR is realized as a p-channel FET, the circuit arrangement according to the invention can be used as a so-called high-side switch in a motor vehicle, for example.

The areas of the auxiliary transistors STR may be different and selected appropriately. Alternatively, the areas of the auxiliary transistors STR may respectively be equal and have a value which is a fraction of the area of the load transistor LTR.

It should be mentioned that the procedure of automatically connecting the auxiliary transistors in parallel in an optional manner or in a manner dependent on the load current, as described here, for setting an appropriate sense ratio can also be combined with the solution described in DE 198 12 920 A1 mentioned above, in which, in order to set an appropriate sense ratio, in an optional manner or in a manner dependent on the load current, a number of load transistors may be provided and operated individually or as a plurality connected in parallel. The details of a circuit arrangement of this type are described extensively in DE 198 12 920 A1 cited above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement for controlling and detecting a load current through a load, the circuit arrangement comprising:
    a load transistor having a control terminal, a load path, a first load path terminal and a second load path terminal, the load being connected in series with the load path of the load transistor to define a series circuit, this series circuit being connected between terminals for a supply potential and a reference potential;
    at least one auxiliary transistor having a control terminal, a load path, a first load path terminal and a second load path terminal;
    a current measuring circuit having a first and second input respectively connected to the first load path terminal of the load transistor and to the first load path terminal of the at least one auxiliary transistor and having an output, at which a signal dependent on the load current can be tapped off;
    a drive unit connected to the control terminal of the load transistor;
    at least one second auxiliary transistor, which is of identical type to the at least one auxiliary transistor, the at least one second auxiliary transistor having a control terminal, which is controllably connected to the control terminal of the load transistor, and having a load path;
    switching means for controllably connecting the load path of the at least one second auxiliary transistor in parallel with the at least one auxiliary transistor, depending on the load current or depending on a load path voltage obtained across the load path of the load transistor; and
    detection means that detect if the load current falls below a threshold and thereupon generate an output signal that is applied to the switching means.

2. The circuit arrangement as claimed in claim 1, wherein the switching means is set up for connecting the load paths of n auxiliary transistors in parallel, where n is greater than, or equal to, 2 and each of the n auxiliary transistors have a control terminal, a load path, a first load path terminal and a second load path terminal.

3. The circuit arrangement as claimed in claim 2, wherein the detection means prescribes n threshold values for the load current and generates the output signal in such a way that n switches of the switching means are acted upon in accordance with the load current respectively falling below a threshold value.

4. The circuit arrangement as claimed in claim 2, wherein the control terminals of all the auxiliary transistors are connected to the control terminal of the load transistor and the second load path terminals of the auxiliary transistors are jointly connected to the second load path terminal of the load transistor, and wherein the switching means is set up in such a way that it optionally connects the first load path terminals of the auxiliary transistors to one another and to the second input of the current measuring arrangement.

5. The circuit arrangement as claimed in claim 4, wherein the switching means has n individual switches each having a first pole and a second pole, which can be connected to the first pole by means of a switching signal, of which the first pole is respectively connected to the first load path terminal of each of the auxiliary transistors and the second poles of all n switches are jointly connected to the second input of the current measuring arrangement.

6. The circuit arrangement as claimed in claim 5, wherein the drive unit supplies the switching signals for the optional actuation of each individual switch in uncoded fashion.

7. The circuit arrangement as claimed in claim 5, wherein the switching means furthermore has decoding means, and wherein the drive unit supplies a coded switching signal, which is decoded by the decoding means.

8. The circuit arrangement as claimed in claim 7, wherein the decoding means has a demultiplexer.

9. The circuit arrangement as claimed in claim 2, wherein all the auxiliary transistors are connected in parallel by their load paths and the switching means is set up in such a way that it optionally connects the control terminals of the auxiliary transistors individually, as a plurality or jointly to the control terminal of the load transistor.

10. The circuit arrangement as claimed in claim 9, wherein the switching means have n individual switches each having a first pole and a second pole, which can be connected to the first pole by means of a switching signal, of which the first pole is respectively connected to the control terminal of the respective auxiliary transistors and the second poles of all switches are jointly connected to the control terminal of the load transistor.

11. The circuit arrangement as claimed in claim 10, wherein the drive unit supplies the switching signals for the optional actuation of each individual switch in uncoded fashion.

12. The circuit arrangement as claimed in claim 10, wherein the switching means furthermore has decoding means, and wherein the drive unit supplies a coded switching signal, which is decoded by the decoding means.

13. The circuit arrangement as claimed in claim 12, wherein the decoding means has a demultiplexer.

14. The circuit arrangement as claimed in claim 9, wherein the switching means is integrated in the drive unit and the latter supplies individual drive signals for the optional driving of the control terminals of the auxiliary transistors.

15. The circuit arrangement as claimed in claim 1, wherein the current measuring arrangement has a comparator which, on the input side, is connected to the first and second inputs of the current measuring arrangement and, on the output side, is connected to a control terminal of a regulating transistor, a current sensing resistor being connected downstream of the regulating transistor at a load path terminal and a second load path terminal of the regulating transistor being connected to the second input of the current measuring arrangement.

16. The circuit arrangement as claimed in claim 15, wherein the load transistor and the auxiliary transistors are formed as n-channel FET and the regulating transistor is formed as a P-channel FET.

17. The circuit arrangement as claimed in claim 16, wherein the load is connected to the source electrode of the load transistor and the reference potential is a lower potential than the supply potential.

18. The circuit arrangement as claimed in claim 1, wherein the detection means has at least one second comparator having a first and second input and an output, the first input of the second comparator being connected to the first input of the current measuring arrangement and a potential corresponding to the threshold current being applied to the second input.

* * * * *